United States Patent
Rehmeyer et al.

(10) Patent No.: US 11,417,411 B2
(45) Date of Patent: Aug. 16, 2022

(54) SYSTEMS AND METHODS FOR POWER SAVINGS IN ROW REPAIRED MEMORY

(71) Applicant: Micron Technology, Inc., Boise, ID (US)

(72) Inventors: James S. Rehmeyer, Boise, ID (US); Yoshinori Fujiwara, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/089,394

(22) Filed: Nov. 4, 2020

(65) Prior Publication Data
US 2022/0139489 A1 May 5, 2022

(51) Int. Cl.
*G11C 29/44* (2006.01)
*G11C 11/408* (2006.01)

(52) U.S. Cl.
CPC ...... *G11C 29/4401* (2013.01); *G11C 11/4087* (2013.01)

(58) Field of Classification Search
CPC .......... G11C 29/4401; G11C 11/4087
See application file for complete search history.

(56) References Cited

U.S. PATENT DOCUMENTS

| | | | |
|---|---|---|---|
| 2008/0120514 A1* | 5/2008 | Ismail | G06F 1/32 713/320 |
| 2012/0275257 A1* | 11/2012 | Park | G11C 8/06 365/230.01 |
| 2014/0085959 A1* | 3/2014 | Saraswat | G11C 5/025 365/63 |
| 2017/0285992 A1* | 10/2017 | Vogt | G11C 7/10 |
| 2018/0314595 A1* | 11/2018 | Eichmeyer | G06F 11/1048 |
| 2021/0304838 A1* | 9/2021 | Johnson | G11C 8/06 |

* cited by examiner

*Primary Examiner* — Thien Nguyen
(74) *Attorney, Agent, or Firm* — Fletcher Yoder, P.C.

(57) ABSTRACT

A memory device includes a memory bank that includes a first set of memory rows in a first section of the memory bank, a first set of redundant rows in a first section of the memory bank, a second set of memory rows in a second section of the memory bank, and a second set of redundant rows in the second section of the memory bank. The memory bank also includes a repeater blocker circuit that when in operation selectively blocks a signal from transmission to the second section of the memory bank and blocker control circuitry that when in operation transmits a control signal to control the selective blocking of the signal by the repeater blocker circuit.

17 Claims, 5 Drawing Sheets

SYSTEMS AND METHODS FOR POWER SAVINGS IN ROW REPAIRED MEMORY

BACKGROUND

Field of the Present Disclosure

Embodiments of the present disclosure relate generally to the field of semiconductor devices. More specifically, embodiments of the present disclosure relate to reducing power consumption associated with memory activation particularly memory having repaired rows.

Description of Related Art

A semiconductor memory device, such as a dynamic random-access memory (DRAM), may store data as bits in memory cells that are implemented using capacitors and transistors. For example, the charge state (e.g., charged or discharged) of a capacitor may determine whether a memory cell stores "1" or "0" as a binary value. Large numbers of memory cells may be packed into the semiconductor memory device, along with additional logic that, for example, enables reading data to, writing data from, and refreshing data in, the memory cells.

The memory cells may be organized as rows and columns, and each memory cell may be accessed via a memory address that includes a row address and a column address, which are processed by row and column address decoders. After a row or word line is selected or activated via the row address for a read operation, bits from all memory cells in the row are transferred into sense amplifiers that form a row buffer, from which a bit is selected via the column address. Because a read operation transfers memory cell charges into the row buffer, the memory cells may be rewritten to retain their values (e.g., prior to the read operation). Write operations decode the addresses in a similar manner, with entire rows being rewritten to change a single bit of a memory cell.

Due to manufacturing errors and/or failures, certain memory cells may be defective. Quality control testing may be used to identify rows and/or columns containing such defective memory cells. If the number of defective memory cells is small, a pre-packaging reassignment of memory cells may be used to prevent discarding of otherwise functional devices. In such systems, additional addressable data cells (e.g., redundant rows and/or columns) may be made available during manufacturing and the address associated with a defective row and/or column may be reassigned to a redundant row and/or column. Such reassignment may be hardwired. For example, the reassignment information may be stored in a non-volatile storage device (e.g., blowing fuses or antifuses disposed within the memory device). Such operation is not easily reversible due to the non-volatility of the storage device.

In the course of usage of the memory device, other memory rows and/or columns may fail and present defective cells. In order to increase the lifetime of the memory devices in the presence of these defects, post-package repair (PPR) methods may be employed to repair the memory device. Regardless of the techniques applied to repair the memory device (either pre-packaging or post packaging), as the density of components disposed on electronic devices increases, power consumption of those devices continues to an important consideration. With this in mind, it is desirable to provide improved systems and methods for accessing of memory cells of a memory device more efficiently. Embodiments of the present disclosure may be directed to one or more of the problems set forth above.

DETAILED DESCRIPTION

Figure 1:
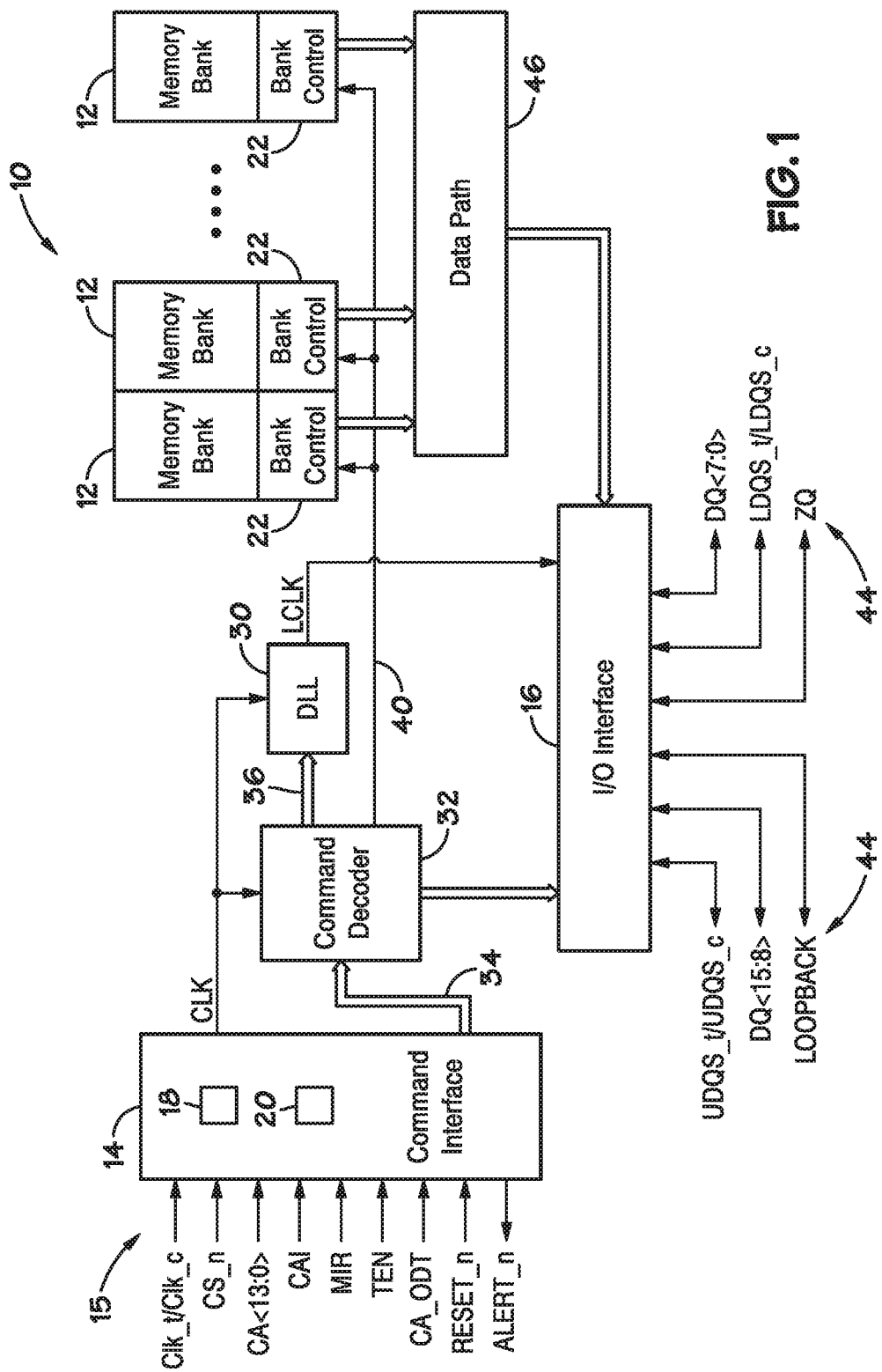
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. Several memory devices may perform storage using electronic memory cells, such as capacitors, flip-flops, latches and/or inverter loops, among others. Examples of memory devices include random access memories (RAMs) devices, dynamic RAM (DRAMs) devices, static RAM (SRAMs) devices, and/or flash memories. In such systems, the memory cells may be grouped in memory arrays, which may be addressed in groups (e.g., rows and/or columns). In the present application, the descriptions of the embodiments are related to memory arrays containing memory cells organized in rows (e.g., data rows). It should be understood that the methods and systems described herein may be used in memory devices having memory cells organized in columns.

During certain operations, such as reading and writing operations, a controller in the memory device may receive an address for a memory cell. The memory device controller may determine which memory bank contains the requested memory cell and request access from the corresponding memory bank controller. In turn, the memory bank controller may identify and activate the data row (e.g., using a row address value corresponding to a row of the memory bank from the received address) containing the requested memory cell, to perform the requested operation. In certain memory devices, the memory bank may include additional data rows, which may be redundant rows. Certain schemes may be implemented such that if a defective row is identified, the defective row may be deactivated and a redundant row may be used in its place. To that end, a non-volatile memory system may store information such as the assigned address of the defective row, and the address of the redundant row to be used in its place. Such repair is described herein as redundant row repair.

One technique for redundant row repair is an any-to-any row repair scheme, whereby redundant rows of a memory bank of a memory device can be assigned to any defective row of that memory bank (i.e., the redundant rows may be physically distant from the defective row). This technique allows for robust repairs of the memory device to be implemented. However, use of the any-to any row repair may not always allow for inclusion of power saving techniques regarding blocking of signals based on received row address information. Accordingly, present techniques herein describe modified any-to-any row repair schemes that allow for any-to-any row repair scheme, but prioritize the use of redundant rows to allow for power saving techniques via blocking of signals based on received row address information.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10 may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×4, ×8, or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to receive a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command, via bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data path 46, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for an ×16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the I/O pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
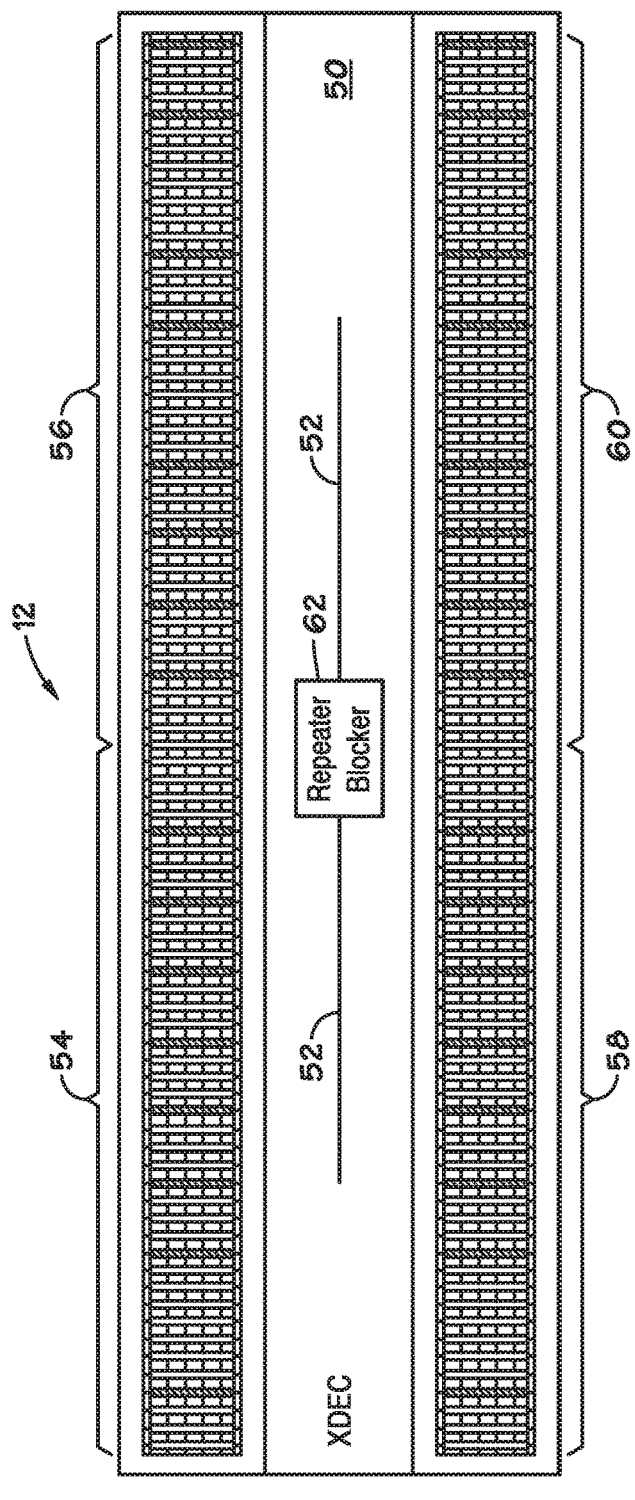
FIG. 2 is a block diagram of a first embodiment of a bank control block and a memory bank of the memory device of FIG. 1, according to an embodiment of the present disclosure.

FIG. 2 illustrates an embodiment of the bank control block 22 and an associated memory bank 12. The bank control block 22 which provides the necessary decoding (e.g., row decoder and column decoder), as well as other features, such as timing control and data control, to facilitate the execution of commands to and from the memory bank 12. The bank control block 22 (e.g., bank logic), as illustrated, includes row match and latch circuits 48 that operate to reduce power consumption during operation of the memory device 10. The row match and latch circuits 48 operate to block the toggling of signals into the XDEC (e.g., the x-line decoder or row decoder) area 50 (i.e., the XDEC stripe or row decoder area). The XDEC area 50 includes one or more signal paths 52 (e.g., signal paths) that transmit signals to section 54 and section 56 of the memory bank 12 and can be part of memory bank 12 or adjacent to and coupled to the memory bank 12. Likewise, the one or more signal paths 52 transmit signals to section 58 and section 60 of the memory bank 12.

Also included in the XDEC area 50 is a repeater blocker circuit 62. A repeater circuit portion of the repeater blocker circuit 62 operates to repeat signals as they are transmitted to sections 56 and 60 so as to reduce signal degradation that might otherwise occur as the signals are transmitted along the one or more signal paths 52 across the XDEC area 50. The blocker circuit portion of the repeater blocker circuit 62 selectively blocks signals from transmission to section 56 and section 60, as will be discussed in greater detail below. In some embodiments, the repeater circuit portion of the repeater blocker circuit 62 operates as the blocker circuit portion of the repeater blocker circuit 62 when disabled via a control circuit (e.g., via a transmitted control signal generated by a control circuit) and the repeater circuit portion of the repeater blocker circuit 62 operates as the repeater circuit portion of the repeater blocker circuit 62 when enabled (or otherwise activated) via the control circuit (e.g., via a transmitted control signal generated by the control circuit). Moreover, while a single repeater blocker circuit 62 is illustrated, it should be noted that the techniques described herein apply to memory banks 12 having two or more repeater blocker circuits 62.

The memory bank 12 may utilize an any-to-any row repair scheme whereby a defective row (e.g., a defective memory row) in section 54 or section 56 can be replaced by a redundant row disposed in either of section 54 or section 56. Similarly, a defective row in section 58 or section 60 can be replaced by a redundant row disposed in either of section 54 or section 56. In other embodiments, a defective row in any of section 54, section 56, section 58, and section 60 can be replaced by a redundant row in any of section 54, section 56, section 58, and section 60. In this manner additional addressable data cells (e.g., redundant rows) are made available during manufacturing and when a row of the memory bank 12 is determined to be defective, the address associated with the defective row is reassigned to a redundant row. The any-to-any row repair scheme makes all redundant rows accessible for reassignment.

In operation, address signals (signals to access a particular portion of the memory bank 12) are received by the bank control block 22. Redundancy match circuits (of the row match and latch circuits 48) operate to read the address signals and determine if the row to be accessed has been reassigned and, if so, facilitate the routing of the signals corresponding to the desired address (via latch circuits of the row match and latch circuits 48, for example, row factor latch logic that operates subsequent to an incoming row address being updated by a row match circuit of the bank control block 22) along the XDEC area 50 to the correct reassigned redundant row of the memory bank 12 so that the correct row is activated. Likewise, if the addressed row has not been repaired (e.g., reassigned to a redundant row), the row match and latch circuits 48 direct signals to the addressed (non-repaired) location to activate the requested row. In this manner, the bank control block 22 can determine which row (i.e., the precise location of the row in one of section 54, section 56, section 58, or section 60) is activated in response to any given received address signal (i.e., whether the addressed row has been repaired through reassignment and where its reassigned row is positioned or whether the row is located at its original location in the memory bank 12).

Not all signals transmitted along the XDEC area 50 are necessary to be transmitted along the entirety of the one or more signal paths 52 (i.e., both before and after the repeater blocker circuit 62 to the near side of the memory bank 12 adjacent section 54 and 58 and to the far side of the memory bank 12 adjacent section 56 and 60). For example, IDD0 represents the current consumed during an activation and a precharge of a row, which corresponds to power consumed by the memory bank 12 to execute an activate (ACT) command and a precharge (PRE command). This current IDD0 transmitted along the one or more signal paths 52 need not be transmitted to section 56 and section 60 if the row to be accessed is in section 54 or section 58. In this case, the blocker circuit portion of the repeater blocker circuit 62 may operate to block repetition of the IDD0 signal along the portion of the one or more signal paths 52 adjacent to section 56 and section 58. Thus, because row address terms (e.g., a received row address value or row address information) are determined by the row match and latch circuits 48, the determined address term may be employed to block signals in the blocker circuit portion of the repeater blocker circuit 62 from toggling in the XDEC area 50 when they are not needed. That is, row terms determined by the row match and latch circuits 48 can be transmitted to the blocker circuit portion of the repeater blocker circuit 62 (e.g., inclusive of NAND logic or other logic) and utilized to block the repeating of signals (e.g., sense amplifier signals, IDD0, etc.) to portions of the memory bank 12 (e.g., section 56 and section 60) that are not being activated (either directly via an address of a row or via a redundant row that is being accessed). Through the selective blocking of signals at the repeater blocker circuit 62 controlled by the row term determined by the bank control block 22, specifically the row match and latch circuits 48, power consumption of the memory bank 12 and, thus, the memory device 10 overall, can be reduced.

Figure 3:
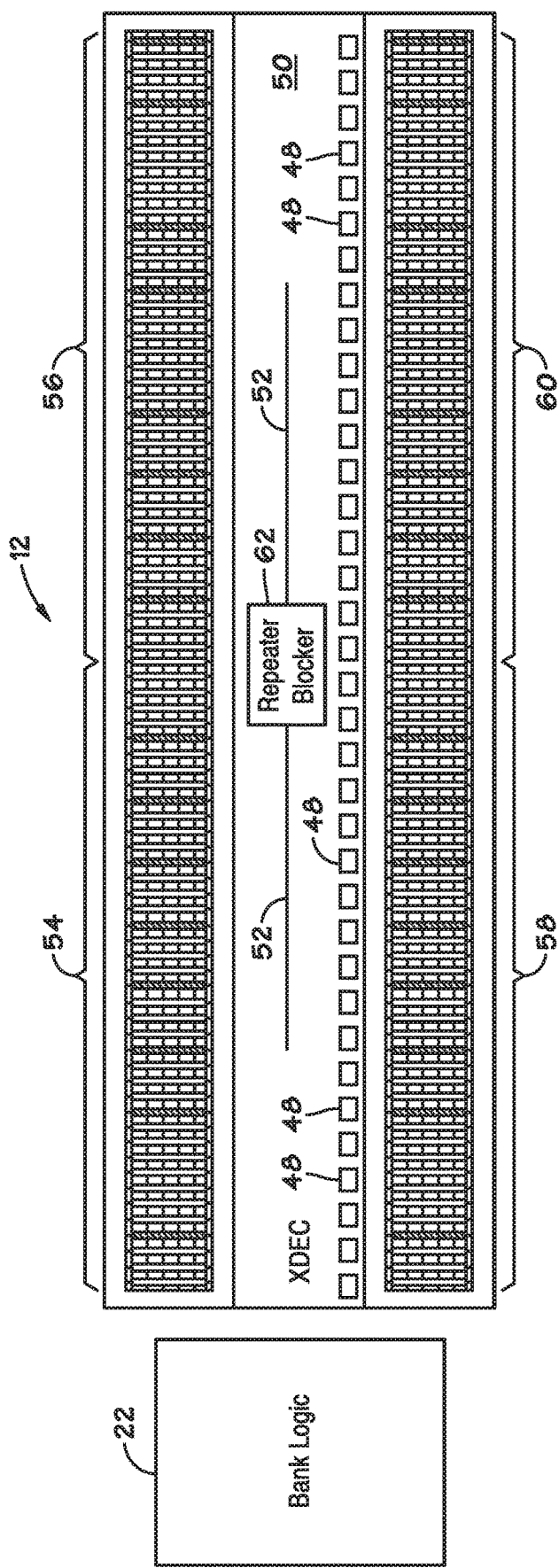
FIG. 3 is a block diagram of a second embodiment of a bank control block and a memory bank of the memory device of FIG. 1, according to an embodiment of the present disclosure.

While power savings of the memory device 10 are desirable, other constraints are also present, such as footprint of the memory device. Thus, for example, it may be advantageous to alter an aspect ratio of the die or other dimensions of the memory device 10. One manner to assist in altering the physical layout of the memory device 10 includes removing the row match and latch circuits 48 from the bank control block 22 and disposing them in the XDEC area 50. FIG. 3 illustrates an embodiment of the bank control block 22 in which the row match and latch circuits 48 have been reallocated to the XDEC area 50.

While the reallocation of the row match and latch circuits 48, as illustrated in FIG. 3, may have some layout advantages, the bank control block 22 of FIG. 3 no longer is able to determine which of section 54, section 56, section 58, or section 60 is being activated prior to transmission of signals along the one or more signal paths 52, in contrast with the operations described above with respect to FIG. 2. That is, when an address is received at the bank control block of FIG. 3, because the row match and latch circuits 48 do not determine whether and where any redundant reassigned row is positioned, the bank control block 22 is unable to provide row term signals to the repeater blocker circuit 62 to selectively block the repeating of signals to portions of the memory bank 12 (e.g., section 56 and section 60).

To allow for current savings (and their associated power savings) described in conjunction with FIG. 2 to be realized with the layout of the memory bank 12 and the bank control block 22 present in FIG. 3, the following techniques and circuits may be employed. In one embodiment, the any-to-any row repair scheme may be modified so that assignment of redundant rows that are physically disposed in section 54 and section 58 (i.e., disposed before the repeater blocker circuit 62) are prioritized (i.e., utilized) before any redundant rows that are physically disposed in section 56 and section 60 are utilized. Most memory banks 12 in the memory device 10 utilize only a fraction of their total redundant rows; therefore, by prioritizing the use of the redundant rows physically disposed in section 54 and section 58 first, the memory banks 12 can utilize their respective repeater blocker circuits 62 to selectively block the repeating of signals to portions of the memory bank 12 (e.g., section 56 and section 60) when, for example, the redundant rows physically disposed in section 56 and section 60 are not in use and a row address (e.g., a row address value) that corresponds to a row to be accessed corresponds to a row in section 54 and/or section 58. Moreover, the use of redundant rows in section 56 and section 60 is not prohibited; their use is merely deprioritized (i.e., used only once there are no more available redundant rows in section 54 and 58).

In another embodiment, the any-to-any row repair scheme may be modified so that assignment of redundant rows that are physically disposed in section 56 and/or and section 60 (i.e., disposed after the repeater blocker circuit 62) are prioritized for use in repairing rows in section 56 and/or section 60 prior to their being used in repairing rows in section 54 and/or section 58. Again, most memory banks 12 in the memory device 10 utilize only a fraction of their total redundant rows; therefore, by prioritizing the use of the redundant rows physically disposed in section 56 and/or section 60 to first repair of rows located in section 56 and section 60, the memory banks 12 can utilize their respective repeater blocker circuits 62 to selectively block the repeating of signals to portions of the memory bank 12 (e.g., section 56 and section 60). This may occur when, for example, the redundant rows physically disposed in section 56 and section 60 are not in use to repair rows in section 54 or 58 and a row address that is received corresponds to a row in section 54 and/or section 58. Moreover, the use of redundant rows in section 56 and section 60 to repair rows in section 54 and 58 is not prohibited; their use is merely deprioritized (i.e., used only once there are no more available redundant rows in section 54 and 58).

In conjunction with FIG. 3, the row match and latch circuits 48 in the XDEC area 50 each include, for example, one or more fuses and latches that operate to latch repair information such that when an address is transmitted along the one or more signal paths 52, the row match and latch circuits 48 in the XDEC area 50 determine whether there is a match of the address with a row that corresponds to the respective row match and latch circuit 48 (i.e., whether the address corresponds to the addressed row in the section accessed by that respective row match and latch circuit 48 or whether the address corresponds to a redundant row to be accessed as a repair row for the transmitted address).

Thus, in one embodiment, for any memory bank 12 that requires a number of redundant rows that exceeds those present in section 54 and 58, redundant rows in section 56 and 60 are available for use (albeit with the loss of current reduction for that bank, as the repeater blocker circuits 62 would thereafter be unable to selectively block the repeating of signals to portions of that memory bank 12, i.e., section 56 and section 60). Likewise, in an embodiment, for any memory bank 12 that requires a number of redundant rows from section 56 or section 60 to repair a row in section 54 or section 58, redundant rows in section 56 and 60 are available for use (albeit with the loss of current reduction for that bank, as the repeater blocker circuits 62 would thereafter be unable to selectively block the repeating of signals to portions of that memory bank 12, i.e., section 56 and section 60). However, the overall power savings would be increased using the above described techniques as a modified any-to-any row repair scheme (that prioritizes the use of redundant rows in section 54 and 58 prior to the use of redundant rows in section 56 and section 60 or prioritizes the use of redundant rows in section 56 and 60 to repair rows present in section 56 and section 60 prior to the use of redundant rows in section 56 and section 60 to repair rows present in section 54 and section 58) relative to a traditional any-to-any row repair scheme that does not include the prioritization schemes described above. Likewise, the modified any-to-any row repair scheme can choose which redundant rows in section 56 and/or section 60 to use first (e.g., the nearest redundant rows to the repeater blocker circuit 62 can be first utilized when redundant rows in section 56 and/or section 60 are used).

Figure 4:
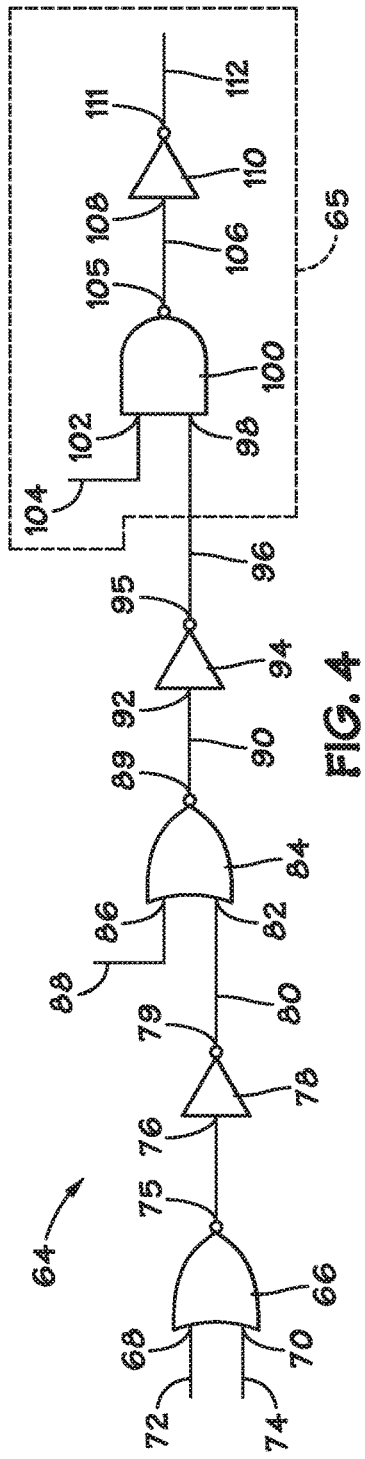
FIG. 4 is a circuit diagram of blocker control circuitry associated with the memory bank of FIG. 3, according to an embodiment of the present disclosure.

FIG. 4 illustrates an embodiment of blocker control circuitry 64 that can operate as a control circuit to generate a control signal to control the operation of a repeater circuit 65 (e.g., a repeater circuit portion) of the repeater blocker circuit 62. The blocker control circuitry 64 can be utilized in conjunction with a modified any-to-any row repair scheme described above to reduce power consumption. It should be noted that the configuration illustrated in FIG. 4 presents a particular embodiment of the blocker control circuitry 64; however, alternate circuit configurations can be implemented to selectively generate a control signal to control operation of a portion of the repeater blocker circuit 62, for example, the blocker circuit portion of the repeater blocker circuit 62 to selectively block or transmit signals to along the one or more signal paths 52 along the far side of the repeater blocker circuit 62 (e.g., the portion of the one or more signal paths 52 adjacent to section 56 and section 60).

As illustrated, the blocker control circuitry 64 includes an NOR gate 66 with an input 68 (e.g., a pin or other connection) and an input 70 (e.g., a pin or other connection). Input 68 may be coupled to a path 72 (e.g., a line or other conductive pathway) for example, via an input of the blocker control circuitry 64, whereby the path 72 transmits an enable value from a redundant row repair location on the far side of the repeater blocker circuit 62 (e.g., from a first redundant row location of section 56 or section 60 nearest to the repeater blocker circuit 62). This enable value (e.g., enable signal) is indicative of whether the particular redundant row is active (e.g., a high signal or binary "1" if it is active) or whether the particular redundant row is disabled (e.g., a low signal or binary "0" if it is disabled).

Input 70 may be coupled to a path 74, for example, via an input of the blocker control circuitry 64, whereby the path 74 transmits an enable value (e.g., enable signal) from another redundant row repair location on the far side of the repeater blocker circuit 62 (e.g., from a second redundant row location of section 56 or section 60 second nearest to the repeater blocker circuit 62). It should be noted that additional enable values from additional redundant row location of section 56 or section 60 may additionally be transmitted to the NOR gate 66 (i.e., NOR gate 66 may have more than the two inputs 68 and 70). Likewise, the NOR gate 66 can be eliminated (along with inverter 78) and, for example, path 72 can instead be coupled directly to the input 82 of NOR gage 84 and path 74 can be decoupled from the blocker control circuitry 64 and/or otherwise removed.

The use of two (or more) enable values can operate as a redundancy measure so that if one of the chosen redundant rows on the far side of the repeater blocker circuit 62 is defective, the result of the NOR gate 66 is unaffected. That is, the result of the NOR gate 66 can provide a more robust determination as to whether the memory bank 12 is using redundant rows in section 56 or section 60 as part of the modified any-to-any row repair scheme if more than one enable value is provided to the blocker control circuitry 64.

The result of the NOR gate 66 is transmitted from an output 75 (e.g., a pin or other connector) of the NOR gate 66 as a result signal to the input 76 of the inverter 78. An output 79 of the inverter 78 transmits a generated result from the inverter 78 along path 80 to an input 82 of NOR gate 84. The NOR gate 84 additionally includes an input 86 that is coupled to path 88 for example, via an input of the blocker control circuitry 64. Path 88 may, for example, transmit an indication of the row address (e.g., a row address value or row address information) to input 86 (i.e., a binary low "0" if the row address corresponds to section 54 or 58 and a binary "1" if the row address corresponds to section 56 or 60).

The output 89 of the NOR gate 84 transmits a result along path 90 to an input 92 of inverter 94. The resultant signal is transmitted from the output 95 of the inverter 94 along path 96 to an input 98 of NAND gate 100 of the repeater circuit 65. The NAND gate 100 additionally includes an input 102 that is coupled to path 104. Path 104 may, for example, transmit a sense amplifier signal or another signal (e.g., IDD0 or a similar signal) to be selectively blocked via the blocker circuit portion of the repeater blocker circuit 62. In this manner, the path 104 may be an extension of one of the signal paths 52. The result of the NAND gate 100 is transmitted from an output 105 of the NAND gate 100 along path 106 to an input 108 of inverter 110. An output 111 of the inverter 110 transmits the inverted signal from the inverter 110 along path 112 as a control signal, which may be a sense amplifier signal or another signal to be selectively blocked via the blocker circuit portion of the repeater blocker circuit 62. In this manner, as will be described in greater detail below, the blocker control circuitry 64 generates a control signal that is transmitted along path 96 to an input 98 of NAND gate 100 of the repeater circuit 65, whereby the control signal transmitted along path 96 operates to selectively block or allow repeating of the signal transmitted along path 104 from transmission to section 56 and section 60 in conjunction with a modified any-to-any row repair scheme.

In operation, if both of the input 68 and the input 70 receive a low signal (e.g., a signal having a low value, "0") each of those signals each correspond to their respective redundant row in section 56 or section 60 being disabled, i.e., their enable bit being low. This is indicative of selected predetermined redundant rows on the on the far side of the repeater blocker circuit 62 (e.g., in section 56 and section 60 of the memory bank 12) not being utilized. This causes the output 75 of the NOR gate 66 to transmit a high signal to the input 76 of the inverter 78. The inverter 78 inverts this received signal and transmits a low signal to the input 82 of the NOR gate 84. At the other input 86 of the NOR gate 84, a signal received from path 88 can be low, indicating that the row address is on the near side of the repeater blocker circuit 62 (e.g., in section 54 or section 58 of the memory bank 12) or the signal received from path 88 can be high, indicating that the row address is on the far side of the repeater blocker circuit 62 (e.g., in section 54 or section 58 of the memory bank 12).

When the received signal at input 86 of the NOR gate 84 is low and the signal at input 82 is low, this causes the output 89 of the NOR gate 84 to transmit a high signal to the input 92 of the inverter 94. The inverter 94 inverts this received signal and transmits a low signal as a control signal along path 96 to the input 98 of the NAND gate 100. At the other input 102 of the NAND gate 100 is a signal received from path 104 that corresponds to the sense amplifier signal or another signal to be selectively blocked via the blocker circuit portion of the repeater blocker circuit 62. Accordingly, the NAND gate 100 has a low signal at the input 98 and a high signal at the input 102, which causes the NAND gate 100 to transmit a high signal from output 105 to the inverter 110, which inverts the received signal to a low signal.

This low signal is transmitted from an output 111 of the inverter 110 along path 112 and represents blocking of the transmission of the sense amplifier signal or another signal to be selectively blocked via the blocker circuit portion of the repeater blocker circuit 62 that is received along path 104. Thus, the control signal transmitted along path 96, as generated in the manner described above, can operate as an enable signal to activate the blocker circuit portion of the repeater blocker circuit 62 or as a disable signal to deactivate the repeater circuit 65 of the repeater blocker circuit 62. In this manner, the control signal transmitted along path 96, as generated in the manner described above, operates to selectively block the sense amplifier signal or another signal (e.g., IDD0 or a similar signal, which may also be the same signal as present on path 104) via the repeater blocker circuit 62 from transmission to section 56 and section 60 in conjunction with a modified any-to-any row repair scheme. This operation results in a reduction of power consumed by the memory bank 12 and, accordingly, the memory device 10 because there is no corresponding current of power draw from the sense amplifier signal or other signal that would otherwise be transmitted.

In the alternative, if the signal at input 82 of the NOR gate 84 is low (corresponding to each of the signals along path 72 and path 74 being low, as previously described) and the signal at input 86 of the NOR gate 84 is high (indicating that the row address is on the far side of the repeater blocker circuit 62, e.g., in section 56 or section 60 of the memory bank 12), the output 89 of the NOR gate 84 transmits a low signal to the input 92 of the inverter 94. The inverter 94 inverts this received signal and transmits a high signal as a control signal to the input 98 of the NAND gate 100 along path 96. At the other input 102 of the NAND gate 100 is a signal received from path 104 that corresponds to the sense amplifier signal or another signal to be selectively blocked via the blocker circuit portion of the repeater blocker circuit 62. Accordingly, the NAND gate 100 has a high signal at the input 98 and a high signal at the input 102, which causes the NAND gate 100 to transmit a low signal from output 105 to the inverter 110, which inverts the received signal to a high signal.

This high signal is transmitted from an output 111 of the inverter 110 along path 112 represents transmission of the sense amplifier signal or another signal to be selectively blocked via the blocker circuit portion of the repeater blocker circuit 62 that is received along path 104. For example, the control signal transmitted along path 96, as generated in the manner described above, can operate as a disable signal to deactivate the blocker circuit portion of the repeater blocker circuit 62 or as an enable signal to activate the repeater circuit 65 of the repeater blocker circuit 62. In this manner, the control signal transmitted along path 96, as generated in the manner described above, operates to allow the sense amplifier signal or another signal (e.g., IDD0 or a similar signal) to be repeated and transmitted to section 56 and section 60. Thus, the blocker control circuitry 64 (when no redundant rows are enabled in section 56 and section 60) operates to selectively control the transmission of the sense amplifier signal or another signal (e.g., IDD0 or a similar signal) based upon the row address (i.e., the signal is blocked if the row address corresponds to a row in section 54 or section 58 and the signal is transmitted if the row address corresponds to a row in section 56 or 60).

The above process was described for situations in which no redundant row in section 56 or section 60 was enabled. However, if instead, for example, one or more redundant rows are enabled (i.e., if one or both of the signals transmitted to input 68 and input 70 of NOR gate 66 is a high signal), then the NOR gate 66 will generate a signal with a low value (i.e., a low signal). This signal having a low value is transmitted from the output 75 of the NOR gate 66 to the input 76 of the inverter 78. The inverter 78 inverts the received signal and transmits a high signal from the output 79 of the inverter 78 to the input 82 of the NOR gate 84.

Regardless of the value of the signal received from path 88, because the value of the signal received at the input 82 is high, the result generated by the NOR gate 84 is high. This high signal is transmitted from the output 89 of the NOR gate 84 to the input 92 of the inverter 94. The inverter 94 inverts the received signal and transmits a resultant low signal as a control signal from the output 95 of the inverter 94 along path 96 to the input 98 of the NAND gate 100. At the other input 102 of the NAND gate 100 is a signal received from path 104 that corresponds to the sense amplifier signal or another signal to be selectively blocked via the blocker circuit portion of the repeater blocker circuit 62. Accordingly, the NAND gate 100 has a high signal at the input 98 and a high signal at the input 102, which causes the NAND gate 100 to transmit a low signal from output 105 to the inverter 110, which inverts the received signal to a high signal.

This high signal is transmitted from an output 111 of the inverter 110 along path 112 represents transmission of the sense amplifier signal or another signal to be selectively blocked via the blocker circuit portion of the repeater blocker circuit 62 that is received along path 104. For example, the control signal transmitted along path 96, as generated in the manner described above, can operate as a disable signal to deactivate the blocker circuit portion of the repeater blocker circuit 62 or as an enable signal to activate the repeater circuit 65 of the repeater blocker circuit 62. In this manner, the control signal transmitted along path 96, as generated in the manner described above, operates to allow the sense amplifier signal or another signal (e.g., IDD0 or a similar signal) to be repeated and transmitted to section 56 and section 60. Thus, the blocker control circuitry 64 (when redundant rows are enabled in section 56 and section 60) operates to disable any blocking of the transmission of the sense amplifier signal or another signal (e.g., IDD0 or a similar signal) based upon at least one of the redundant rows in section 56 and section 60 being enabled.

Figure 5:
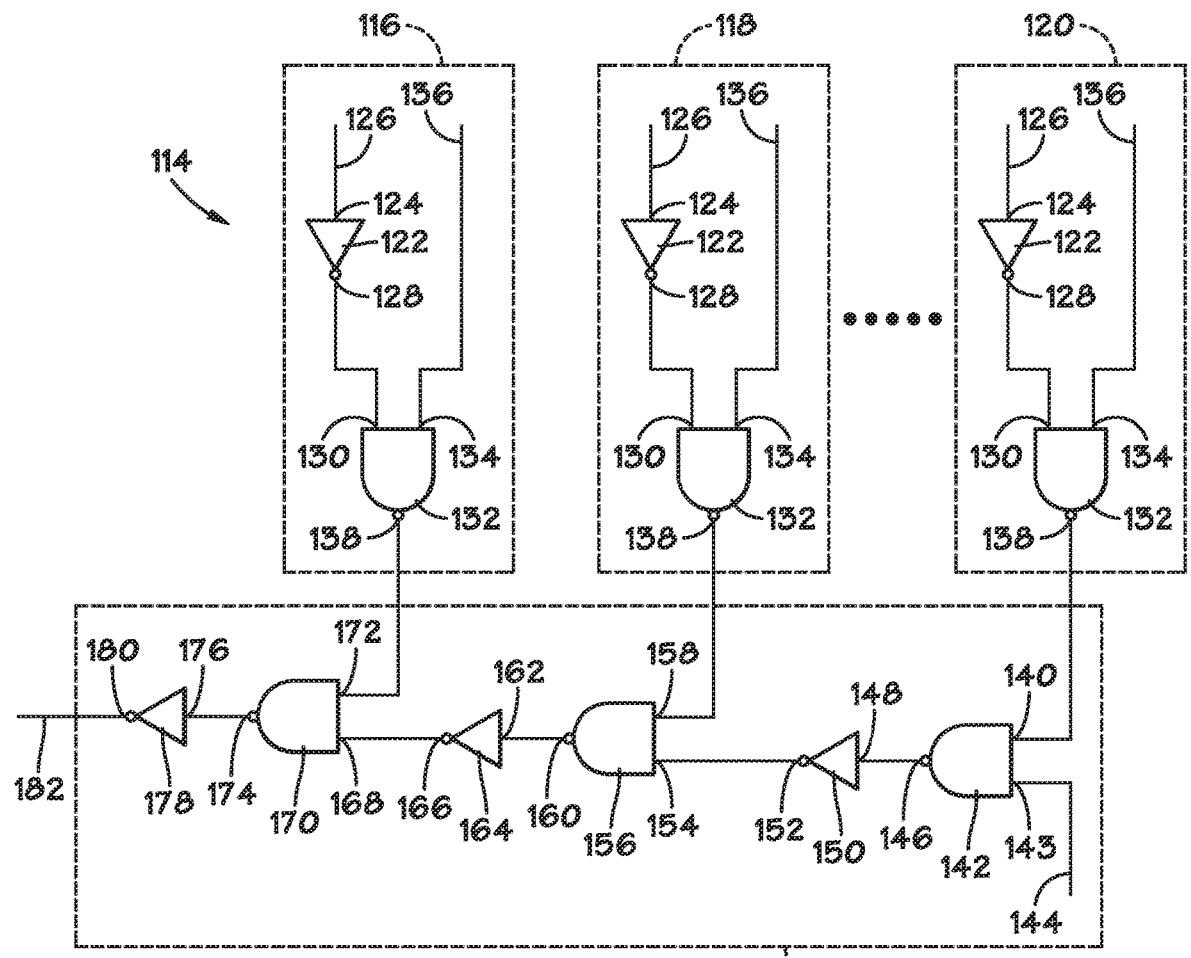
FIG. 5 is a circuit diagram of monitoring circuitry including a second embodiment of blocker control circuitry associated with the memory bank of FIG. 3, according to an embodiment of the present disclosure.

Other modifications to an any-to-any row repair scheme can be applied. For example, FIG. 5 illustrates an embodiment of monitoring circuitry 114 that may operate as a control circuit to generate a control signal to control the operation of the repeater blocker circuit 62. The monitoring circuitry 114, inclusive of blocker control circuitry 139, can be utilized in conjunction with a modified any-to-any row repair scheme to reduce power consumption. This modified any-to-any row repair scheme may include prioritizing use of redundant rows that correspond to section 56 and section 60 to repair failed rows in section 56 and section 60 prior to their use in repairing failed rows in section 54 and section 58. The technique outlined with respect to FIG. 5 can benefit from at least some of the power savings outlined above with respect to FIG. 4 and may additionally allow for greater use of the total number of redundant rows of the memory bank 12.

Illustrated in FIG. 5 are a series of redundant rows (of which only three of the full series of, for example, one hundred twenty eight redundant rows are illustrated for purposes of explanation). More particularly, FIG. 5 illustrates redundant row 116 (e.g., redundant row 0, representing the first redundant row of section 56), redundant row 118 (e.g., redundant row 1, representing the second redundant row of section 56), continuing to redundant row 120 (e.g., redundant row 127, representing the last redundant row of section 56). Each of redundant row 116, redundant row 118, and redundant row 120 include address fuses (e.g., address A0-address A15) that when blown, in combination, correspond to the particular address that the redundant row 116, redundant row 118, and redundant row 120 repairs (i.e., the fuses blown, in combination, corresponds to the address of the row repaired by a given redundant row 116, redundant row 118, and redundant row 120). The value of one of these address fuses (e.g., the state of one of these address fuses, for example, A15) corresponds to the section to which the particular redundant row 116, redundant row 118, and redundant row 120 is assigned (e.g., a low value "0" corresponds to section 54 and a high value "1" corresponds to section 56) and may be termed, for example, a location indication.

As illustrated, each of redundant row 116, redundant row 118, and redundant row 120 includes an inverter 122 The input 124 of the inverter 122 is coupled to a respective path 126 to receive the value of one of the address fuse (e.g., A15) as a location indication that corresponds to the section (e.g., section 54 or section 56) that the particular redundant row 116, redundant row 118, and redundant row 120 is assigned (e.g., a low value "0" on path 126 corresponds to section 54 and a high value "1" on path 126 corresponds to section 56). The inverter 122 additionally includes an output 128 (e.g., a pin or other connection) that is coupled to an input 130 (e.g., a pin or other connection) of a NAND gate 132. The NAND gate 132 additionally includes an input 134 coupled to path 136. Path 136 for each respective redundant row 116, redundant row 118, and redundant row 120 receives and transmits the enable information of the respective redundant row 116, redundant row 118, and redundant row 120 (i.e., an indication of whether the respective redundant row 116, redundant row 118, and redundant row 120 has been enabled and, accordingly, is in use). Each NAND gate 132 further includes an output 138 that in operation transmits a resultant signal from the NAND gate 132 as a mapping indication. This output 138 may be considered the output of each of redundant row 116, redundant row 118, and redundant row 120 or may be considered an output of each of redundant row 116, redundant row 118, and redundant row 120 may be coupled to the output 138

Taking redundant row 116, for example to describe the operation of any of redundant row 116, redundant row 118, and redundant row 120, if the redundant row 116 is enabled, a high signal (i.e., "1") is transmitted to input 134. Furthermore, if the address that redundant row 116 is mapped to is in section 54, the value transmitted to input 124 is a low signal (e.g., "0"), which is inverted by the inverter 122 and transmitted to input 130 of the NAND gate 132 as a high signal. As signals transmitted to the input 130 and the input 134 of the NAND gate 132 are each high, the NAND gate 132 outputs a low signal from output 138. Thus, if the redundant row 116 is mapped to section 54 and is enabled, the output signal transmitted from the output 138 of the NAND gate 132 is low.

If, however, the redundant row 116 is enabled, thus transmitting a high signal to input 134 and if the address that redundant row 116 is mapped to is in section 56, the value transmitted to input 124 is a high signal, which is inverted by the inverter 122 and transmitted to input 130 of the NAND gate 132 as a low signal. As signal transmitted to the input 130 is a low signal and the input 134 of the NAND gate 132 is a high signal, the NAND gate 132 outputs a high signal from output 138. Thus, if the redundant row 116 is mapped to section 56 and is enabled, the output signal transmitted from the output 138 of the NAND gate 132 is high. Finally, if the redundant row 116 is not enabled, the signal at input 134 is low and the output signal of the NAND gate 132 is high. Thus, in only one situation does the output 138 of the NAND gate 132 of redundant row 116 transmit a low signal; when the address that redundant row 116 is mapped to is in section 54 (i.e., when a redundant row in section 56 or 60 is mapped to section 54 or 58), indicating the prioritized mapping of the redundant rows consistent with the second embodiment of a modified any-to-any row repair scheme has been obstructed. This situation applies similarly to the remaining redundant rows of the series of redundant rows, including redundant row 118 and redundant row 120.

The monitoring circuitry 114 of FIG. 5 further includes blocker control circuitry 139. It should be noted that the configuration illustrated in FIG. 5 of the monitoring circuitry 114 and/or the blocker control circuitry 139 presents one embodiment of the circuitry; however, alternate circuit configurations can be implemented to selectively generate a control signal for transmission to the repeater blocker circuit 62. The blocker control circuitry 139 receives the output signals from each of the series of redundant rows (inclusive of redundant row 116, redundant row 118, and redundant row 120).

The output 138 of the NAND gate 132 of redundant row 120 (as the last redundant row in the series of redundant rows) is coupled to an input 140 of NAND gate 142 an input 143 of the NAND gate is coupled to path 144, which may be coupled to a voltage source or another source of a high signal. The output 146 of the NAND gate 142 is coupled to an input 148 of inverter 150. The output 152 of the inverter 150 is coupled to an input 154 of NAND gate 156. Another input 158 of the NAND gate 156 is coupled to the output 138 of the NAND gate 132 of redundant row 118 (as the second redundant row in the series of redundant rows). The output 160 of the NAND gate 156 is coupled to an input 162 of inverter 164. It should be noted that the layout of the NAND gate 156 receiving an input from a previous redundant row and transmitting an output signal to inverter 164 can be repeated for the remaining non-illustrated redundant rows of the series of redundant rows.

The output 166 of the inverter 164 is coupled to an input 168 of NAND gate 170. Another input 172 of the NAND gate 170 is coupled to the output 138 of the NAND gate 132 of redundant row 116 (as the first redundant row in the series of redundant rows). The output 174 of the NAND gate 170 is coupled to an input 176 of inverter 178. The output 180 of the inverter 178 is coupled to path 182, which can be coupled to the repeater blocker circuit 62. It should be recognized that as illustrated, the state of the signal on path 182 is inverted by inverter 178 such that a low signal (e.g., a signal having a low value, "0") will enable transmission at the repeater blocker circuit 62. Likewise, a high signal (e.g., a signal having a high value, "1") will disable transmission at the repeater blocker circuit 62. However, this result could be reversed, for example, by removal of the inverter 178.

Thus, the signal transmitted along path 182 (e.g., via an output of the blocker control circuitry 139 or the monitoring circuitry 114) to the repeater blocker circuit 62 can operate as a control signal that, based on its value, disables at least a portion of the repeater blocker circuit 62 (e.g., the blocker circuit portion of the repeater blocker circuit 62). For example, the outputs 138 of the NAND gates 132 of redundant row 118 and redundant row 120 may be a high signal (indicating that the addresses that redundant row 118 and redundant row 120 is mapped to is in section 56 (or section 60)). In contrast, the output 138 of the NAND gate 132 of redundant row 116 may be a low signal (indicating that the address that redundant row 116 is mapped to is in section 54 (or section 58). Thus, the NAND gate 142 receives high signals at each of input 140 and input 143. In response to receiving these high signals, the NAND gate 142 transmits a low signal at output 146, which is inverted to a high signal by inverter 150 and transmitted from output 152 of the inverter 150 to input 154 of the NAND gate 156. Input 158 of the NAND gate 156 also receives a high signal (from the output 138 of the NAND gate 132 of redundant row 118). In response to receiving these high signals, the NAND gate 156 transmits a low signal at output 160, which is inverted to a high signal by inverter 164 and transmitted from output 166 of the inverter 164 to input 168 of the NAND gate 170.

However, as described above for the present example, input 172 of the NAND gate 170 does not receive a high signal, but rather a low signal (from the output 138 of the NAND gate 132 of redundant row 116). In response to receiving one high signal and one low signal as input signals, the NAND gate 170 transmits a high signal at output 174, which is inverted to a low signal by inverter 178 and transmitted from output 180 of the inverter 178 along path 182. This low signal on path 182 corresponds to a deactivation signal (e.g., it disables the blocking of signals by the repeater blocker circuit 62 or otherwise allows for the repeating of the signals by the repeater blocker circuit 62), since a redundant row on the far side of the repeater blocker circuit 62 is mapped to an address location on the near side of the repeater blocker circuit 62. Thus, the signal transmitted along path 182 can be a control signal transmitted to the blocker circuit portion of the repeater blocker circuit 62 and when the value of the control signal is low, the blocker circuit of the repeater blocker circuit 62 is disabled (allowing for signal repeating to occur) in response to the prioritized mapping of the redundant rows consistent with the second embodiment of a modified any-to-any row repair scheme having been obstructed (i.e., the power savings corresponding to the second embodiment of a modified any-to-any row repair scheme are disabled).

In another example, the signal transmitted along path 182 (e.g., via an output of the blocker control circuitry 139 or the monitoring circuitry 114) to the repeater blocker circuit 62 can operate as a control signal that, based on its value, enables (or activates) at least a portion of the repeater blocker circuit 62 (e.g., the blocker circuit portion of the repeater blocker circuit 62). For example, the outputs 138 of the NAND gates 132 of redundant row 118, redundant row 120, and redundant row 116 may be a high signal (indicating that the addresses that redundant row 118 and redundant row 120 is mapped to is in section 56 (or section 60)). Thus, the NAND gate 142 receives high signals at each of input 140 and input 143. In response to receiving these high signals, the NAND gate 142 transmits a low signal at output 146, which is inverted to a high signal by inverter 150 and transmitted from output 152 of the inverter 150 to input 154 of the NAND gate 156. Input 158 of the NAND gate 156 also receives a high signal (from the output 138 of the NAND gate 132 of redundant row 118). In response to receiving these high signals, the NAND gate 156 transmits a low signal at output 160, which is inverted to a high signal by inverter 164 and transmitted from output 166 of the inverter 164 to input 168 of the NAND gate 170.

Likewise, input 172 of the NAND gate 170 also receives a high signal from the output 138 of the NAND gate 132 of redundant row 116. In response to receiving high signals as input signals at each of input 168 and 172, the NAND gate 170 transmits a low signal at output 174, which is inverted to a high signal by inverter 178 and transmitted from output 180 of the inverter 178 along path 182. This high signal on path 182 corresponds to an activation signal (e.g., it enables or activates the blocking of signals by the repeater blocker circuit 62, thus preventing the repeating of signals), since a no redundant rows on the far side of the repeater blocker circuit 62 are mapped to an address location on the near side of the repeater blocker circuit 62. Thus, the signal transmitted along path 182 can be a control signal transmitted to the blocker circuit portion of the repeater blocker circuit 62 and when the value of the control signal is high, the blocker circuit of the repeater blocker circuit 62 is enabled or activated (to block signal repeating) in response to the prioritized mapping of the redundant rows consistent with the second embodiment of a modified any-to-any row repair scheme being operative (i.e., the power savings corresponding to the second embodiment of a modified any-to-any row repair scheme are maintained).

Figure 6:
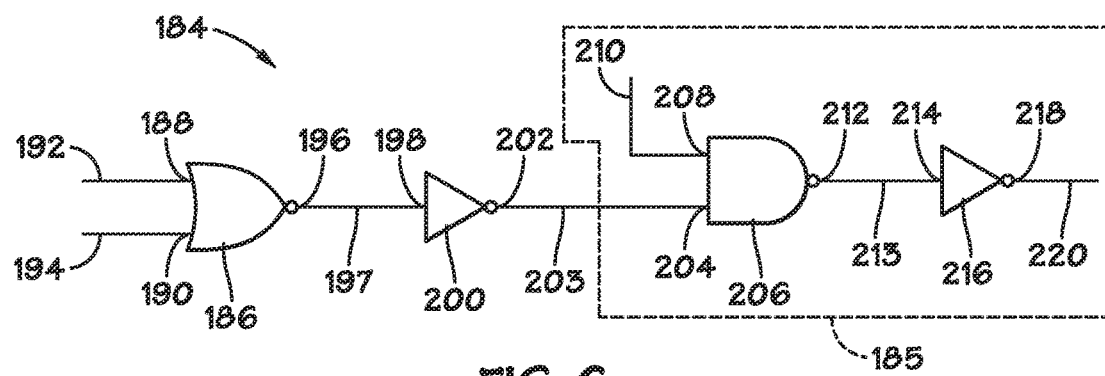
FIG. 6 is a circuit diagram of a third embodiment of blocker control circuitry associated with the memory bank of FIG. 3, according to an embodiment of the present disclosure.

FIG. 6 illustrates an embodiment of blocker control circuitry 184 as a portion of the repeater blocker circuit 62 that can operate as a control circuit to generate a control signal to control the operation of a repeater circuit 185 (e.g., a repeater circuit portion similar to the repeater circuit 65 discussed above) of the repeater blocker circuit 62. The blocker control circuitry 184 can be utilized in conjunction with a modified any-to-any row repair scheme described above to reduce power consumption. It should be noted that the configuration illustrated in FIG. 6 presents a particular embodiment of the blocker control circuitry 184; however, alternate circuit configurations can be implemented to selectively generate a control signal to control operation of a portion of the repeater blocker circuit 62, for example, the blocker circuit portion of the repeater blocker circuit 62 to selectively block or transmit signals to along the one or more signal paths 52 along the far side of the repeater blocker circuit 62 (e.g., the portion of the one or more signal paths 52 adjacent to section 56 and section 60).

As illustrated, the blocker control circuitry 184 includes an NOR gate 186 with an input 188 and an input 190. Input 188 may be coupled to a path 192 (e.g., a line or other conductive pathway), for example, via an input of the blocker control circuitry 184, whereby the path 192 transmits a value of the fuse (e.g., the state of the fuse) from an additional fuse added to each memory bank 12. This additional fuse transmits an indication of whether any redundant rows from the far side of the repeater blocker circuit 62 (e.g., redundant rows in section 56 or section 60) have been mapped to repair a row from the far side of the repeater blocker circuit 62 (e.g., repair a defective memory row in section 54 or section 58). Thus, similar to FIG. 5 described above, the modification to an any-to-any row repair scheme can be applied in conjunction with FIG. 6 whereby the modified any-to-any row repair scheme may include prioritizing use of redundant rows that correspond to section 56 and section 60 to repair failed rows in section 56 and section 60 before their use to repair failed rows in section 54 and section 58.

If a high signal is transmitted from the additional fuse of the memory bank 12, no redundant repair rows in section 56 or 60 have been mapped to repair any row (e.g. a defective memory row) from section 54 and 58. As will be discussed below, this will allow the row address signal to control activation of the blocker circuit portion of the repeater blocker circuit 62 or deactivation of the repeater circuit 185 of the repeater blocker circuit 62. If a low signal is transmitted from the additional fuse of the memory bank 12, at least one redundant repair row in section 56 or 60 has been mapped to repair at least one row from section 54 and 58. Therefore, the blocker circuit portion of the repeater blocker circuit 62 will be deactivated and/or the repeater circuit 185 of the repeater blocker circuit 62 will be activated to preclude any blocking of signals by the repeater blocker circuit 62.

Input 190 of the NOR gate 186 is coupled to path 194, for example, via an input of the blocker control circuitry 64. Path 194 may, for example, transmit an indication of the row address (e.g., the row address value) to input 190 (i.e., a binary low "0" if the row address corresponds to section 54 or 58 and a binary "1" if the row address corresponds to section 56 or 60). In this manner, input 190 receives an indication of the row address being transmitted (i.e., if the row address corresponds to the near side of the repeater blocker circuit 62 or the far side of the repeater blocker circuit 62). The result of the NOR gate 186 is transmitted along path 197 to an input 198 of inverter 200. The resultant signal from the output 202 of the inverter 200 is transmitted along path 203 to an input 204 of NAND gate 206. The NAND gate 206 additionally includes an input 208 that is coupled to path 210. Path 210 may, for example, transmit a sense amplifier signal or another signal (e.g., IDD0 or a similar signal) to be selectively blocked via the blocker circuit portion of the repeater blocker circuit 62. In this manner, the path 210 may be an extension of one of the signal paths 52.

The result of the NAND gate 206 is transmitted from an output 212 of the NAND gate 206 along path 213 to an input 214 of inverter 216. An output 218 of the inverter 216 transmits the inverted signal from the inverter 216 along path 220 as a control signal, which may be a sense amplifier signal or another signal to be selectively blocked via the blocker circuit portion of the repeater blocker circuit 62. In this manner, as will be described in greater detail below, the blocker control circuitry 184 generates a control signal that is transmitted along path 203 to an input 204 of NAND gate 206 of the repeater circuit 185, whereby the control signal transmitted along path 203 operates to selectively block or allow repeating of the signal transmitted along path 210 from transmission to section 56 and section 60 in conjunction with a modified any-to-any row repair scheme.

In operation, if both of the inputs 188 and 190 receive a low signal (e.g., a signal having a low value, "0"), this is indicative of one or more redundant rows on the on the far side of the repeater blocker circuit 62 (e.g., in section 56 and section 60 of the memory bank 12) not being utilized as well as the received row address referencing a memory row located on the near side of the repeater blocker circuit 62 (e.g., in section 54 or section 58 of the memory bank 12). When the received signal at input 188 of the NOR gate 186 is low and the signal at input 190 is low, this causes the output 196 of the NOR gate 186 to transmit a high signal to the input 198 of the inverter 200. The inverter 200 inverts this received signal and transmits a low signal as a control signal along path 203 to the input 204 of the NAND gate 206. At the other input 208 of the NAND gate 206 is a signal received from path 210 that corresponds to the sense amplifier signal or another signal to be selectively blocked via the blocker circuit portion of the repeater blocker circuit 62.

Accordingly, the NAND gate 206 has a low signal at the input 204 and a high signal at the input 208, which causes the NAND gate 206 to transmit a high signal from output 212 to the inverter 216, which inverts the received signal to a low signal. This low signal is transmitted from an output 218 of the inverter 216 along path 220 and represents blocking of the transmission of the sense amplifier signal or another signal to be selectively blocked via the blocker circuit portion of the repeater blocker circuit 62 that is received along path 210. Thus, the control signal transmitted along 203 as generated in the manner described above can operate as an enable signal to activate the blocker circuit portion of the repeater blocker circuit 62 or as a disable signal to deactivate the repeater circuit 185 of the repeater blocker circuit 62. In this manner, the control signal transmitted along path 203 as generated in the manner described above operates to selectively block the sense amplifier signal or another signal (e.g., IDD0 or a similar signal, which may also be the same signal as present on path 210) via the repeater blocker circuit 62 from transmission to section 56 and section 60 in conjunction with a modified any-to-any row repair scheme. This operation results in a reduction of power consumed by the memory bank 12 and, accordingly, the memory device 10 because there is no corresponding current of power draw from the sense amplifier signal or other signal that would otherwise be transmitted.

In the alternative, if the signal at input 188 of the NOR gate 186 is low (corresponding to one or more redundant rows on the on the far side of the repeater blocker circuit 62 in section 56 and section 60 of the memory bank 12 not being utilized) and the signal at input 190 of the NOR gate 186 is high (indicating that the row address is referencing a memory row located on the far side of the repeater blocker circuit 62, e.g., in section 56 or section 60 of the memory bank 12), the output 196 of the NOR gate 186 transmits a low signal to the input 198 of the inverter 200. The inverter 200 inverts this received signal and transmits a high signal as a control signal along path 203 to the input 204 of the NAND gate 206. At the other input 208 of the NAND gate 206 is a signal received from path 210 that corresponds to the sense amplifier signal or another signal to be selectively blocked via the blocker circuit portion of the repeater blocker circuit 62. Accordingly, the NAND gate 206 has a high signal at the input 204 and a high signal at the input 208, which causes the NAND gate 206 to transmit a low signal from output 212 to the inverter 216, which inverts the received signal to a high signal.

This high signal is transmitted from an output 218 of the inverter 216 along path 220 represents transmission of the sense amplifier signal or another signal to be selectively blocked via the blocker circuit portion of the repeater blocker circuit 62 that is received along path 104. For example, the control signal transmitted along path 203 as generated in the manner described above can operate as a disable signal to deactivate the blocker circuit portion of the repeater blocker circuit 62 or as an enable signal to activate the repeater circuit 185 of the repeater blocker circuit 62. In this manner, the control signal transmitted along path 203 as generated in the manner described above operates to allow the sense amplifier signal or another signal (e.g., IDD0 or a similar signal) to be repeated and transmitted to section 56 and section 60. Thus, the blocker control circuitry 64 (when no redundant rows are enabled in section 56 and section 60) operates to selectively control the transmission of the sense amplifier signal or another signal (e.g., IDD0 or a similar signal) based upon the row address (i.e., the signal is blocked if the row address corresponds to a row in section 54 or section 58 and the signal is transmitted if the row address corresponds to a row in section 56 or 60).

The above process was described for situations in which no redundant row in section 56 or section 60 was enabled. However, if instead, for example, one or more redundant rows are enabled, the signal transmitted to input 188 NOR gate 186 is a high signal. Regardless of the value of the signal received from path 194, because the value of the signal received at the input 188 is high, the result generated by the NOR gate 186 is low.

This low signal is transmitted from the output 196 of the NOR gate 186 to the input 198 of the inverter 200. The inverter 200 inverts the received signal and transmits a resultant high signal as a control signal along path 203 from the output 202 of the inverter 200 to the input 204 of the NAND gate 206. At the other input 208 of the NAND gate 206 is a signal received from path 210 that corresponds to the sense amplifier signal or another signal to be selectively blocked via the blocker circuit portion of the repeater blocker circuit 62. Accordingly, the NAND gate 206 has a high signal at the input 204 and a high signal at the input 208, which causes the NAND gate 206 to transmit a low signal from output 212 to the inverter 216, which inverts the received signal to a high signal.

This high signal transmitted from an output 218 of the inverter 216 along path 220 represents transmission of the sense amplifier signal or another signal to be selectively blocked via the blocker circuit portion of the repeater blocker circuit 62 that is received along path 210. For example, the control signal transmitted along path 203 as generated in the manner described above can operate as a disable signal to deactivate the blocker circuit portion of the repeater blocker circuit 62 or as an enable signal to activate the repeater circuit 185 of the repeater blocker circuit 62. In this manner, the control signal transmitted along path 203, as generated in the manner described above, operates to allow the sense amplifier signal or another signal (e.g., IDD0 or a similar signal) to be repeated and transmitted to section 56 and section 60. Thus, the blocker control circuitry 64 (when redundant rows are enabled in section 56 and section 60) operates to disable any blocking of the transmission of the sense amplifier signal or another signal (e.g., IDD0 or a similar signal) based upon at least one of the redundant rows in section 56 and section 60 being enabled.

Figure 7:
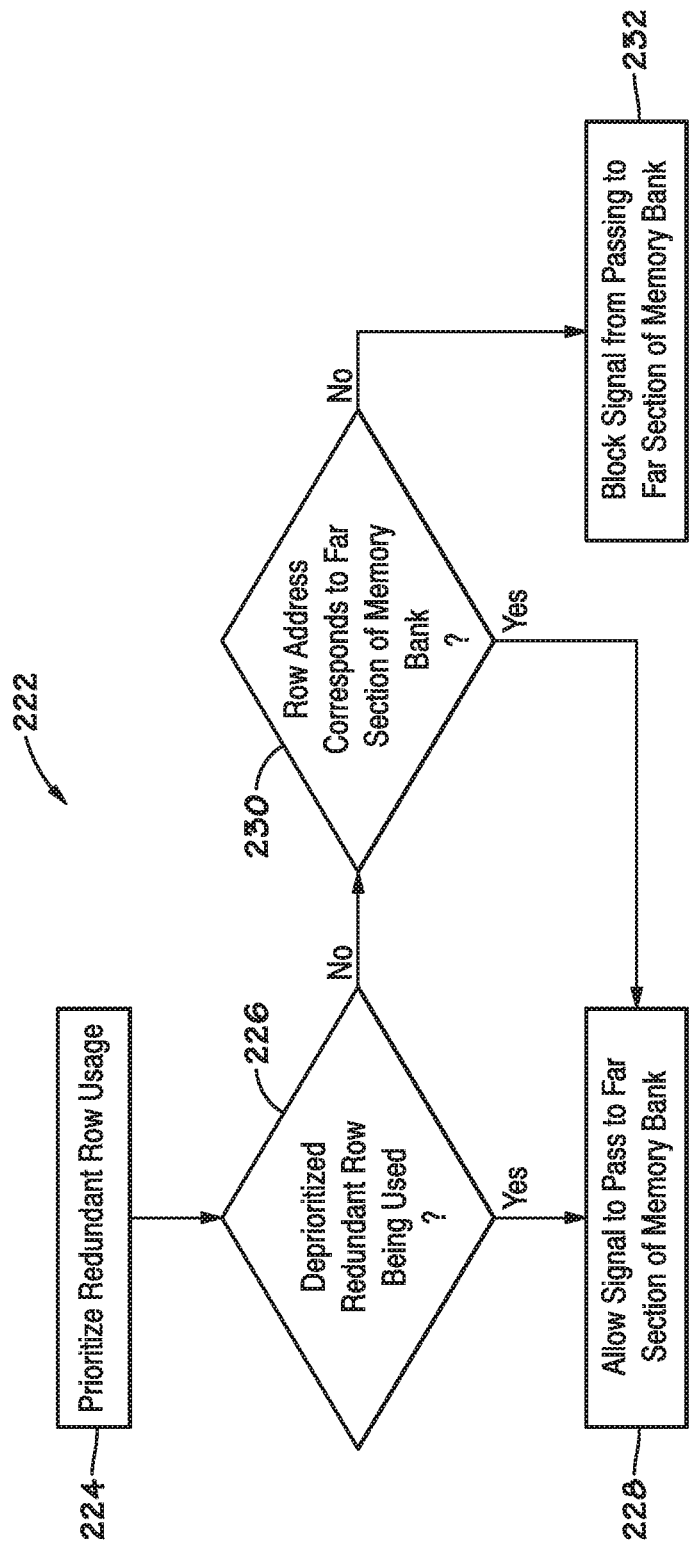
FIG. 7 is a flow chart of a method of implementing a modified any-to-any row repair scheme in conjunction with the of the memory bank of FIG. 3, according to an embodiment of the present disclosure.

FIG. 7 illustrates a method 222 of implementing a modified any-to-any row repair scheme. In step 224, the redundant row usage of a memory bank 12 can be set so that the use of some redundant rows are prioritized with respect to other redundant rows of the memory bank 12. For example, the prioritization may include using the redundant rows in section 54 and section 58 to repair damaged or otherwise failed rows of the memory bank 12 prior to using the redundant rows in section 56 and section 60 of the memory bank 12. Alternatively, the prioritization may include using the redundant rows in section 56 and section 60 to repair damaged or otherwise failed rows of section 56 and section 60 prior to using the redundant rows in section 54 and section 58 of the memory bank 12 to repair damaged or otherwise failed rows of section 56 or section 60. In some embodiments, step 224 may be implemented, for example, by commands received by the command interface 14 and decoded by the command decoder 32.

In step 226, a determination is made of whether the deprioritized redundant rows (i.e., the redundant rows no prioritized in step 224) are being utilized. This determination can be made, for example, by the blocker control circuitry 64 using, for example, the NOR gate 66 in the manner described above with respect to FIG. 4. Likewise, this determination in step 226 can be made using the monitoring circuitry 114 of FIG. 5, for example, via the blocker control circuitry 139. In other embodiments, the determination in step 226 can be made using the blocker control circuitry 184 using, for example, the NOR gate 186 in the manner described above with respect to FIG. 6.

If in step 226, it is determined that the deprioritized redundant rows are being utilized, in step 228 the blocker control circuitry 64, the blocker control circuitry 139, or the blocker control circuitry 184 (respectively) transmit a control signals to the repeater blocker circuit 62 to selectively allow signals to be transmitted to section 56 and section 60 (i.e., transmitted to the far section of the memory bank 12) in conjunction with the modified any-to-any row repair scheme. If, however, if in step 226 it is determined that the deprioritized redundant rows are not being utilized, the process moves to step 230.

In step 230, a determination is made of whether the row address corresponds to the far section of the memory bank 12 (i.e., section 56 or section 60 of the memory bank 12). deprioritized redundant rows (i.e., the redundant rows no prioritized in step 224) are being utilized. That is an indication of whether the received row address from the bank control logic 22 corresponds to a near section of the memory bank 12 (i.e., section 54 or section 58 of the memory bank 12) or whether the received row address from the bank control logic 22 corresponds to a far section of the memory bank 12 (i.e., section 54 or section 58 of the memory bank 12) is received. For example, the row address corresponds to section 54 or 58 if a binary "0" indication is received and the row address corresponds to section 56 or 60 if a binary "1" is received. This determination can be made, for example, by the blocker control circuitry 64 using, for example, the NOR gate 84 in the manner described above with respect to FIG. 4. Likewise, this determination in step 230 can be made using repeater blocker circuit 62 in conjunction with the monitoring circuitry 114 of FIG. 5, for example. In other embodiments, the determination in step 230 can be made using the blocker control circuitry 184 using, for example, the NOR gate 186 in the manner described above with respect to FIG. 6.

If in step 230, it is determined that the row address corresponds to the far section of the memory bank 12, the method proceeds to step 228 in which the blocker control circuitry 64, the blocker control circuitry 139, or the blocker control circuitry 184 (respectively) transmit a control signals to the repeater blocker circuit 62 to selectively allow signals to be transmitted to section 56 and section 60 (i.e., transmitted to the far section of the memory bank 12) in conjunction with the modified any-to-any row repair scheme. If, however, if in step 230 it is determined that the row address does not correspond to the far section of the memory bank 12 (or that the row address corresponds to the near section of the memory bank 12), the process proceeds to step 232.

In step 232, the blocker control circuitry 64, the blocker control circuitry 139, or the blocker control circuitry 184 (respectively) transmit a control signals to the repeater blocker circuit 62 to selectively block signals to be transmitted to section 56 and section 60 (i.e., transmitted to the far section of the memory bank 12) in conjunction with the modified any-to-any row repair scheme. This allows for the power savings of the memory bank 12 and, accordingly, the memory device 10 described above.

It should be noted that the modified any-to-any row repair scheme and techniques described herein can be applied to any and all of the memory banks 12 of the memory device.

Furthermore, the method 222 may be applied to all of the memory banks 12 of a given memory device 10 and the result of each memory bank 12 may differ (e.g., one memory bank 12 may have enough row failures that is step 226, the method proceeds to step 228 while another memory bank 12 may have fewer row failures, thus allowing for the selective blocking of signals in step 232). Regardless, all memory banks 12 may use all redundant rows available, the present techniques describe techniques to determine the manner and priority for their usage to allow for power savings.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
a memory bank, comprising:
a first set of memory rows in a first section of the memory bank;
a first set of redundant rows in the first section of the memory bank;
a second set of memory rows in a second section of the memory bank;
a second set of redundant rows in the second section of the memory bank;
a repeater blocker circuit coupled to the second set of memory rows and the second set of redundant rows, wherein the repeater blocker circuit when in operation selectively blocks transmission of a signal from the first section of the memory bank to the second section of the memory bank; and
blocker control circuitry coupled to the repeater blocker circuit, wherein the blocker control circuitry when in operation transmits a control signal to control selective blocking of the signal by the repeater blocker circuit.

2. The memory device of claim 1, wherein the blocker control circuitry comprises a first input that when in operation receives a first indication of whether a first redundant row of the second set of redundant rows in the second section of the memory bank is active.

3. The memory device of claim 2, wherein the blocker control circuitry comprises a second input that when in operation receives a second indication of whether a second redundant row of the second set of redundant rows in the second section of the memory bank is active.

4. The memory device of claim 3, wherein the blocker control circuitry comprises a third input that when in operation receives an indication of whether a row address value of the memory bank corresponds to the second section of the memory bank.

5. The memory device of claim 4, wherein the blocker control circuitry generates the control signal based upon the indication of whether the row address value of the memory bank corresponds to the second section of the memory bank, the first indication of whether the first redundant row of the second set of redundant rows in the second section of the memory bank is active, and the second indication of whether the second redundant row of the second set of redundant rows in the second section of the memory bank is active.

6. The memory device of claim 1, wherein a first redundant row of the second set of redundant rows of the memory bank comprises a fuse, wherein a state of the fuse comprises a location indication corresponding to whether a first memory row repaired by the first redundant row is located in the first set of memory rows in the first section of the memory bank or is located in the second set of memory rows in the second section of the memory bank.

7. The memory device of claim 6, wherein the first redundant row of the second set of redundant rows of the memory bank comprises a first output that when in operation transmits a mapping indication based upon the location indication and an indication of whether the first redundant row is active.

8. The memory device of claim 7, wherein the blocker control circuitry comprises a first input coupled to the first output, wherein the blocker control circuitry when in operation generates the control signal based upon the mapping indication and at least one additional mapping indication generated by a second redundant row of the second set of redundant rows of the memory bank.

9. The memory device of claim 1, wherein the memory bank comprises a fuse, wherein a state of the fuse comprises a first indication of whether at least one redundant row of the redundant rows of the second set of redundant rows in the second section of the memory bank is mapped to a defective memory row of the first set of memory rows in the first section of the memory bank.

10. The memory device of claim 9, wherein the blocker control circuitry comprises a first input that when in operation receives the first indication.

11. The memory device of claim 10, wherein the blocker control circuitry comprises a second input that when in operation receives a second indication of whether a row address value of the memory bank corresponds to the second section of the memory bank.

12. The memory device of claim 11, wherein the blocker control circuitry generates the control signal based upon the first indication and the second indication.

13. A memory device, comprising:
a memory divided into a first section and a second section;
a row decoder area disposed adjacent to the memory and coupled to the memory, wherein the row decoder area when in operation transmits a plurality of signals to memory rows of the memory via row match and latch circuits disposed in the row decoder area;
a repeater blocker circuit disposed in the row decoder area that when in operation selectively blocks transmission of at least one signal of the plurality of signals from a first portion of the row decoder area adjacent to the first section to a second portion of the row decoder area adjacent to the second section; and
blocker control circuitry that when in operation transmits a control signal to control selective blocking of the signal by the repeater blocker circuit.

14. The memory device of claim 13, wherein the blocker control circuitry generates the control signal based upon a row address value and whether a redundant row in the second section is active.

15. The memory device of claim 13, wherein the blocker control circuitry generates the control signal based upon an indication that a redundant row in the second section is active and is mapped to a memory row in the first section.

16. The memory device of claim 13, wherein the memory comprises a fuse, wherein a state of the fuse comprises an indication of whether at least a redundant row in the second section is active and is mapped to a memory row in the first section.

17. The memory device of claim 16, wherein the blocker control circuitry generates the control signal based upon the indication.

* * * * *